United States Patent
Mani et al.

(10) Patent No.: US 11,750,227 B2
(45) Date of Patent: *Sep. 5, 2023

(54) METHOD AND DEVICE FOR TRANSMITTING A DATA STREAM WITH SELECTABLE RATIO OF ERROR CORRECTION PACKETS TO DATA PACKETS

(71) Applicant: Imagination Technologies Limited, Kings Langley (GB)

(72) Inventors: Senthil Kumar Mani, Hyderabad (IN); Bala Manikya Prasad Puram, Hyderabad (IN); Sowmya Mannava, Hyderabad (IN)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/709,206

(22) Filed: Mar. 30, 2022

(65) Prior Publication Data

US 2022/0224360 A1 Jul. 14, 2022

Related U.S. Application Data

(60) Division of application No. 16/999,540, filed on Aug. 21, 2020, now Pat. No. 11,323,136, which is a
(Continued)

(30) Foreign Application Priority Data

May 2, 2014 (GB) .................................. 1407782
Sep. 30, 2014 (GB) .................................. 1417242

(51) Int. Cl.
*H03M 13/35* (2006.01)
*H04L 43/087* (2022.01)
(Continued)

(52) U.S. Cl.
CPC .......... *H03M 13/353* (2013.01); *G06F 11/10* (2013.01); *H04L 43/087* (2013.01);
(Continued)

(58) Field of Classification Search
CPC ... H04L 43/106; H04L 43/087; H04L 43/028; H04L 65/65; H04L 65/762; H04L 1/0041; H04L 1/0047; H03M 13/353; H03M 13/47
See application file for complete search history.

(56) References Cited

U.S. PATENT DOCUMENTS 6,434,606 B1   8/2002  Borella et al.
7,017,102 B1   3/2006  Kristensson et al.
(Continued)

FOREIGN PATENT DOCUMENTS

EP   1187416 A1   3/2002
EP   1427127 A2   6/2004
(Continued)

OTHER PUBLICATIONS

Network Working Group, Request for Comments: 2733, Dec. 1999, "An RTP payload format for generic Forward Error Correction", Rosenberg J_ & Schulzrinne H. Obtained from: hllps://tools.ielforg/pdf/rfc2733.pdf.
(Continued)

*Primary Examiner* — Shelly A Chase
(74) *Attorney, Agent, or Firm* — Potomac Law Group, PLLC; Vincent M DeLuca (57) ABSTRACT

A method of transmitting data determines a measure of consecutive packet loss in a network; a ratio of a number of data packets and a number of error correction packets is selected in dependence on the measure. A stream of data packets is generated, and a stream of error correction packets is generated in dependence on the stream of data packets
(Continued)

such that the proportion of error correction packets generated to the data packets generated is commensurate with the selected ratio.

20 Claims, 6 Drawing Sheets

Related U.S. Application Data continuation of application No. 14/703,558, filed on May 4, 2015, now Pat. No. 10,778,257.

(51) Int. Cl.
| | | |
|---|---|---|
| H04L 47/625 | (2022.01) | |
| H04L 43/106 | (2022.01) | |
| H04M 7/00 | (2006.01) | |
| G06F 11/10 | (2006.01) | |
| H04L 47/283 | (2022.01) | |
| H04L 47/34 | (2022.01) | |
| H04L 65/65 | (2022.01) | |
| H04L 65/75 | (2022.01) | |

(52) U.S. Cl.
CPC .......... *H04L 43/106* (2013.01); *H04L 47/283* (2013.01); *H04L 47/34* (2013.01); *H04L 47/626* (2013.01); *H04L 65/65* (2022.05); *H04L 65/762* (2022.05); *H04L 65/764* (2022.05); *H04M 7/0084* (2013.01)

(56) References Cited

U.S. PATENT DOCUMENTS

| | | | |
|---|---|---|---|
| 2006/0007943 | A1 | 1/2006 | Fellman |
| 2006/0039280 | A1 | 2/2006 | Anandakumar et al. |
| 2006/0268893 | A1 | 11/2006 | Lataretu |
| 2007/0081471 | A1* | 4/2007 | Talley, Jr. ............ H04L 43/028 370/252 |
| 2009/0138784 | A1 | 5/2009 | Tamura et al. |
| 2009/0201805 | A1 | 8/2009 | Begen et al. |
| 2009/0276678 | A1 | 11/2009 | Ihara |
| 2011/0222530 | A1 | 9/2011 | Vargo et al. |
| 2011/0270964 | A1* | 11/2011 | Huang ................ H04L 43/0864 709/224 |
| 2013/0250938 | A1 | 9/2013 | Anandakumar et al. |
| 2016/0148618 | A1* | 5/2016 | Huang .................. G10L 19/167 381/2 |

FOREIGN PATENT DOCUMENTS

| | | |
|---|---|---|
| EP | 2256991 A1 | 12/2010 |
| EP | 2528287 A1 | 11/2012 |
| GB | 2493081 A | 1/2013 |
| WO | 9522233 A1 | 8/1995 |
| WO | 03029990 A1 | 4/2003 |
| WO | 2011163042 A2 | 12/2011 |
| WO | 2013131561 A1 | 9/2013 |

OTHER PUBLICATIONS

Chin et al., "Improving video quality using packet interleaving, randomisation and redundancy" IEEE Conference on Local Computer Networks, 2001, Dec. 10, 2011, pp. 405-413.
Lopez et al., "Applying traditional VoIP playout delay control algorithms to MANETs", International Caribbean Conference on Devices, Circuits and Systems, 2012.
Wu, "An Improved Statistical Analysis Method for Duty Cycle Distortion Jitter Analysis", 17th International Symposium on Consumer Electronics, 2013.
Hines et al.,"Detailed Comparative Analysis of PESQ and VISQOL Behaviour in the Context of Play Out Delay Adjustment introduced by VoIP Jitter Buffer Algorithms", International Workshop on Quality of Multimedia Experience, 2013.
Chu et al., "End-To-End Performance and Reliability Estimation of PacketCable VoIP Services" 2005.
Kim et al., "Enhancing VoIP Speech Quality Using Combined Playout Control and Signal Reconstruction" IEEE Transactions on Consumer Electronics, vol. 58, No. 2, May 2012.
Kovac et al., "E-Model MOS Estimate Precision Improvement and Modelling of Jitter Effects", Information and Communication Technologies and Services, vol. 10, 2012.
Partila et al., "Jitter Buffer Loss Estimate for Effective Equipment Impairment Factor" International Journal of Mathematics and Computers in Simulation, Issue 3, vol. 7, 2013, pp. 241-248.
Yu et al., "Quality-based Jitter Buffer Algorithm Using Adaptive Variable-Size Window" 2nd International Conference on Computer Science and Network Technology, 2012.
Kim et al.,"VoIP Receiver-Based Adaptive Playout Scheduling and Packet Loss Concealment Technique" IEEE Transactions on Consumer Electronics, vol. 59, No. 1, Feb. 2013.
Chen et al., "VoWLAN Simulations through Novel Playout Buffer Algorithm" Journal of Computers vol. 24, No. 1, Apr. 2013.
Carson et al., NIST Net: a Linux-based network emulation tool. SIGCOMM Comput. Commun. Rev 1, 2003.
Gong et al., "A New Optimum Jitter Protection for Conversational VoIP" IEEE, 2009, pp. 1-5.
Kim et al., "A Novel Playout Algorithm for VoIP Mobile Phone," IEEE 2011, pp. 774-777.
McNeill et al., "An Adaptive Jitter Buffer Play-Out Scheme to Improve VOiP Quality in Wireless Networks," 2006.
Alwakeel et al., "An Adaptive Sender-Based VoIP Loss-Recovery Technique," IEEE 2012, pp. 1-5.
Bayley et al., "Call Quality Monitoring for VoIP," IEEE 2011, pp. 1-4.
Pang et al., "Complexity-Aware Adaptive Jitter Buffer With Time-Scaling," IEEE 2012, pp. 4473-4476.
Halas et al., "Computationally Efficient E-Model Improvement of MOS Estimate Including Jitter and Buffer Losses," IEEE 2012, pp. 86-90.
Syed et al., "Dynamic Adjustment of Weighting and Safety Factors in Playout Buffers for Enhancing VoIP Quality", Science and Information Conference Oct. 7-9, 2013, 20131 London, UK.
Florencio et al., "Enhanced Adaptive Playout Scheduling and Loss Concealment Techniques for Voice over IP Networks" IEEE 2011, pp. 129-132.
Slavata et al., "Impact of Jitter and Jitter Buffer on the Final Quality of the Transferred Voice", the 1st IEEE International Symposium on Wireless Systems within the Conferences on Intelligent Data Acquisition and Advanced Computing Systems Sep. 20-21, 2012, Offenburg, Germany.
Oklander et al., "Jitter Buffer Analysis" IEEE 2008, pp. 1-6.
Mohsen et al., "Jitter-Buffer Management for VoIP over Wireless LAN in a Limited Resource Device", Fourth International Conference on Networking and Services, Mar. 16-21, 2008.
Fu et al., "P2P-based VoIP QoS Management in Heterogeneous Networks" IEEE 2009, pp. 1-3.
Alwakeel et al., "Performance Study of a Random P-Persistence Sender-Based VOiP Loss-Recovery Technique" IEEE 2012, pp. 1-5.
Aamir et al., "QoS Analysis of VoIP Traffic for different Codecs and Frame Counts per Packet in Multimedia Environment using OPNET" IEEE 2012, pp. 1-7.
Kim et al., "VoIP QoS(Quality of Service) Design of Measurement Management Process Model" IEEE 2010, pp. 1-5.
Wu et al., "Perceptual optimization of playout buffer in voip applications" First International Conference on Communications and Networking in China, 2006. ChinaCom '06. Digital Object Identifier: 10.1109/CHINACOM.2006.344719.
Lizhong et al., "An Adaptive Forward Error Control Method for Voice communication," International Conference on Networking and Digital Society, 2010.
Padhye et al., "A new adaptive FEC losscontrol algorithm for voice over IP applications," Pree.IEEE Perf.Computing and Communication Conference, Feb. 2000.

(56) References Cited

OTHER PUBLICATIONS

Bolot et al., "Adaptive FEC-based error control for Internet-telephony," Proc. IEEE Infocom 1999, p. 1453-1460, 1999.
Filho et al., Adaptive Forward Error Correction for Interactive Streaming Over the Internet. GLOBECOM, IEEE,(2006).
Refaey et al., "A new approach for FEC decoding based on the BP algorithm in L TE and WiMAX systems,"Information Theory, Canadian Workshop on. pp. 9-14, May 2011.
Nonnenmacher et al. ,"Parity-based loss recovery for reliable multicast", IEEE/ACM Trans. Networking, vol. 6, pp. 349-361 1998.
Ala' Khalifeh et al.,"A Hybrid Media Transmission Scheme for Wireless VoIP" ,DCC '10 Proceedings of the 2010 Data Compression Conference,2010.
Carson et al., "http://snad.ncsl.nisl.gov/nistnel/nistnel.pdf," "NIST Net-A Linux-based Network Emulation Tool," Jul. 2003 ACM SIGCOMM Computer Communication Review 33(3):111-126.
Shankar, "Error Correcting Codes", Resonance vol. 2, Issue 1, Jan. 1997, pp. 34-43.
Reed et al.,"Reed-Solomon Codes," Wiley-IEEE Press, 1994.
Rosenberg at al., "An RTP Payload Format for Generic Forward Error Correction", RFC 2733,Dec. 1998.
Watson et al., "Forward Error Correction (FEC) Building Block", RFC 5052,Aug. 2002.
Li ,"RTP Payload Format for Generic Forward Error Correction", RFC 5109, Dec. 2007.
Roca et al .,"Low Density Parity Check (LDPC) Staircase and Triangle Forward Error Correction (FEC) Schemes", RFC 5170, Jun. 2008.
Watson, "Basic Forward Error Correction (FEC) Schemes", RFC 5445, Mar. 2009.
Lacan et al.,"Reed-Solomon Forward Error Correction (FEC) Schemes", RFC 5510, Apr. 2009.
(*NOTE: Copies of NPL documents in parent application).

* cited by examiner

METHOD AND DEVICE FOR TRANSMITTING A DATA STREAM WITH SELECTABLE RATIO OF ERROR CORRECTION PACKETS TO DATA PACKETS

BACKGROUND OF THE INVENTION

This invention relates to methods of transmitting and receiving error correction data.

Real-time streaming of multimedia content over the internet has become an increasingly common application in recent years. A wide range of multimedia applications, such as on-demand TV, live TV viewing, video conferencing, net meetings, video telephony, voice over internet protocol (VoIP) and many others rely on end-to-end streaming solutions. Unlike a "downloaded" media file, which may be retrieved first in "non-real" time and viewed or played back later, streaming media applications require a media source to encode and to transmit a media signal over a network to a media receiver, which must decode and play the media signal in real time.

Problems can arise when a media stream is transmitted across a network, such as the Internet. For example, a significant packet loss rate across the transmission network often requires re-transmission of the lost data packets. Typically, the lost data packets need be recovered prior to the time the media data in a packet must be decoded to be played. If the lost packet is not received in time, the media that is played out will be erroneous. For example, in VoIP, a VoIP stream can be impaired by routing, queuing, scheduling and serialization effects, which result in loss and jitter (including delays) to data packets. The main factors affecting voice quality are delay and loss which cannot generally be known in advance to the receiving device because they depend on the real-time behaviour of connections throughout the network. Thus some error correction methods are needed.

Forward Error Correction (FEC) is a method in which some redundant packets are transmitted along with the source data packets. The FEC packets allow packet losses to be recovered at the receiver. The FEC packets may be included in the transmitted stream of data packets before it is known whether any packet losses have occurred at the receiver and if any repairs are necessary. The advantage of FEC is that retransmission of data can often be avoided (at the cost of higher bandwidth requirements on average) and is therefore applied in situations where longer round-trip transmission latencies or the lack of a feedback channel can make retransmissions infeasible or impossible. Typical scenarios include, for example, real-time voice or video data, IP multimedia multicasting, and wireless broadcasting systems.

BRIEF SUMMARY OF THE INVENTION

According to a first aspect of the disclosure there is provided a method of transmitting data, the method comprising: determining a measure of consecutive packet loss in a network; selecting a ratio of a number of data packets and a number of error correction packets in dependence on said measure; generating a stream of data packets; and generating a stream of error correction packets in dependence on the stream of data packets such that the proportion of error correction packets generated is commensurate with the selected ratio.

The determining step may comprise deriving the measure from a histogram having a plurality of bins, each bin representing a number of consecutive missing data packets and having a frequency indicating a number of occurrences of that number of consecutive missing data packets. The deriving may comprise analysing the histogram so as to determine the bin representing the smallest number of consecutive missing data packets which has a predetermined frequency.

The method may further comprise transmitting the stream of data packets and error correction packets.

The method may further comprise receiving the histogram from a receiving device and transmitting the stream of data packets and error correction packets from a transmitting device to the receiving device.

The method may further comprise, prior to deriving the measure, filtering the histogram so as to remove outlier occurrences of consecutive packets lost in the network.

The histogram may be filtered with a filter having a window size dependent on a transmission mode, the mode being dependent on a measure of network quality.

The method may further comprise transmitting the stream of data packets and the stream of error correction packets as different streams.

Each data packet may be associated with a sequence number, and the measure of consecutive packets is dependent on a determination of sequence numbers associated with packets not received at a or the receiving device.

The selected ratio may be dependent on a transmission mode, the mode being dependent on a measure of network quality.

The step of generating a stream of error correction packets may further comprise generating error correction packets in dependence on a packet type of the data packets generated in the stream of data packets.

According to a second aspect of the disclosure there is provided a method of receiving data, the method comprising: receiving data packets at a buffer, each data packet being identifiable by a sequence number, wherein the sequence number identifies an order for packets in a media stream; receiving error correction packets, each error correction packet being associated with one or more sequence numbers and being for use in correcting data packets identifiable by those sequence numbers; determining a subset of error correction packets which are associated with sequence numbers that are missing from the sequence numbers of the data packets at the buffer and identifying the determined subset in a data structure; processing the data structure so as to remove, from the data structure, identifiers of one or more error correction packets associated with sequence numbers of data packets that are unsuitable for correction; and identifying, from the processed data structure, an error correction packet or a combination of error correction packets for generating a missing data packet.

The data packets that are unsuitable for correction may have sequence numbers that do not meet a threshold associated with the timely arrival of packets.

The threshold may be dependent on the playback position of media for the received media stream.

The method may further comprise: generating the missing data packet using the identified error correction packet(s); and inserting the generated data packet into the buffer, wherein the buffer is configured to order the data packets according to their sequence numbers and the generated packet is inserted in accordance with that order.

The method may further comprise, for each of a plurality of the error correction packets identified in the data structure: determining whether the error correction packet is for use in generating a single missing data packet only and, if so:

(i) generating that missing data packet using the error correction packet, and (ii) removing an identifier for that error correction packet from the data structure.

The method may further comprise: determining whether a combination of a plurality of error correction packets identified in the data structure is for use in generating a data packet and, if so, generating that data packet; identifying the sequence number for that generated data packet; and removing, from the data structure, an association of that identified sequence number with an identifier for an error correction packet associated with that identified sequence number.

The data packets may comprise media data for a media stream.

The data packets may be RTP packets.

The error correction packets may be forward error correction packets.

According to a third aspect of the disclosure there is provided a data processing device comprising: an error correction generator configured to: determine a measure of consecutive packet loss in a network; and select a ratio of a number of data packets and a number of error correction packets in dependence on said measure; and a first packetiser configured to generate a stream of data packets, the error correction generator being further configured to generate a stream of error correction packets in dependence on the stream of data packets such that the proportion of error correction packets generated is commensurate with the selected ratio.

The error correction generator may be configured to determine the measure by deriving the measure from a histogram having a plurality of bins, each bin representing a number of consecutive missing data packets and having a frequency indicating a number of occurrences of that number of consecutive missing data packets.

The error correction generator may be configured to derive the measure by analysing the histogram so as to determine the bin representing the smallest number of consecutive missing data packets which has a predetermined frequency.

The error correction generator may be further configured to, prior to deriving the measure, filtering the histogram so as to remove outlier occurrences of consecutive packets lost in the network.

According to a fourth aspect of the disclosure there is provided a data processing device comprising: a first buffer for receiving data packets, each data packet being identifiable by a sequence number, wherein the sequence number identifies an order for packets in a media stream; a second buffer for receiving error correction packets, each error correction packet being associated with one or more sequence numbers and being for use in correcting data packets identifiable by those sequence numbers; and a packet retriever configured to: determine a subset of error correction packets which are associated with sequence numbers that are missing from the sequence numbers of the data packets at the first buffer and identifying the determined subset in a data structure; process the data structure so as to remove, from the data structure, identifiers of one or more error correction packets associated with sequence numbers of data packets that are unsuitable for correction; and identifying, from the processed data structure, an error correction packet or a combination of error correction packets for generating a missing data packet.

The data packets that are unsuitable for correction may have sequence numbers that do not meet a threshold associated with the timely arrival of packets.

The threshold may be dependent on the playback position of media for the received media stream.

The packet retriever may be further configured to: generate the missing data packet using the identified error correction packet(s); and insert the generated data packet into the buffer, wherein the buffer is configured to order the data packets according to their sequence numbers and the generated packet is inserted in accordance with that order.

According to a fifth aspect of the disclosure there is provided machine readable code for implementing any of the methods described above.

According to a sixth aspect of the disclosure there is provided a machine readable storage medium having encoded thereon non-transitory machine-readable code for implementing any of the methods described above.

BRIEF DESCRIPTION OF THE DRAWINGS

The present invention will now be described by way of example with reference to the accompanying drawings. In the drawings.

DETAILED DESCRIPTION OF THE DRAWINGS

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

There is a need for a method of transmitting and receiving error correction packets so that lost data packets can be efficiently recovered.

Figure 1:
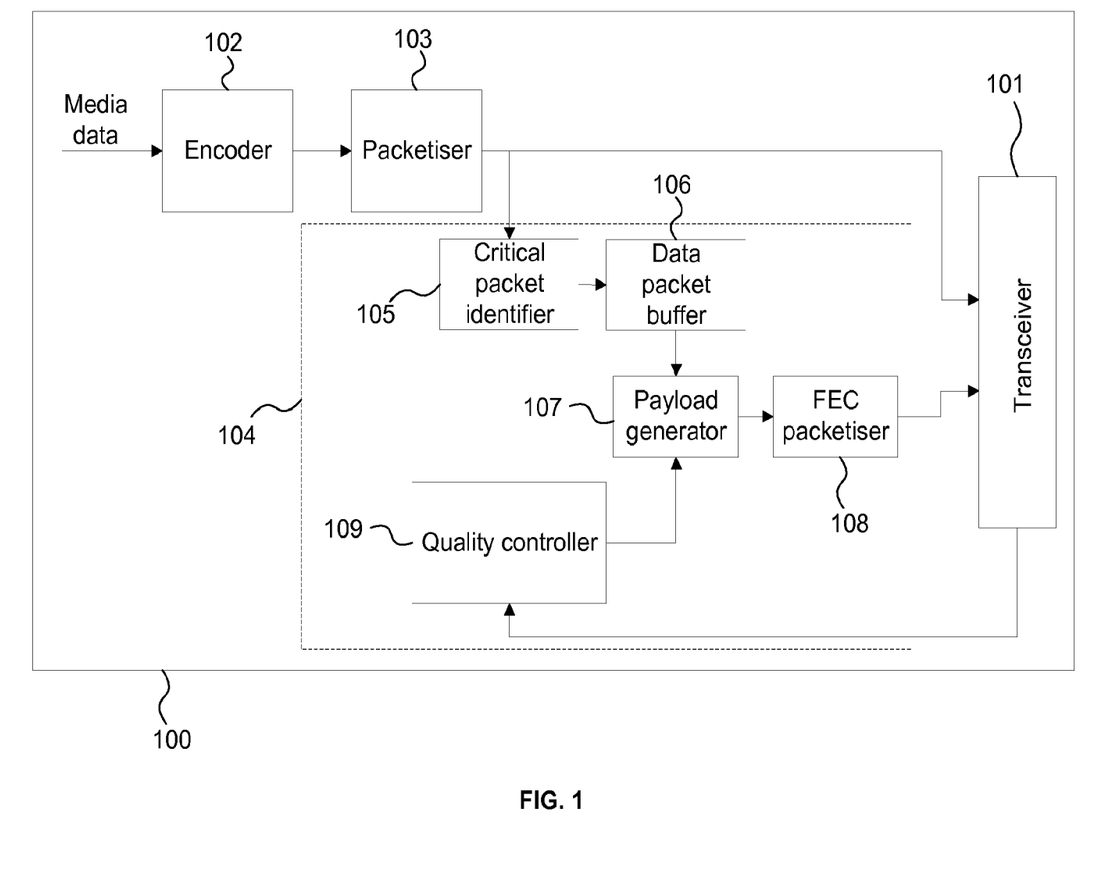
FIG. 1 shows a schematic diagram of a device capable of transmitting data packets and FEC packets.

FIG. 1 shows a transmit path for a data processing device 100, which may be any suitable device that is capable of generating packet based data such as a computer, smartphone, videophone, etc. Device 100 comprises a transceiver 101 for connection to a communications network (not shown) such as the internet or other packet based networks. The device 100 can transmit and/or receive data packets to and/or from the communications network via the transceiver 101.

The data processing device 100 comprises an encoder 102 for encoding a media stream that is to be transmitted over the network to one or more receiving devices. The media stream may comprise video and/or audio data. For example, the media may be a Pulse Code Modulation (PCM) audio stream. The media may be encoded according to an audio and/or video coding standard such as ITU-T G.711, ITU-T G.729AB, ITU-T G.723 and ITU-T G.722, H.263 or H.264 (AVC or ISO/IEC 14496-10) or any other FEC compatible standard.

The device 100 comprises a packetiser 103 which receives the encoded media from the encoder 102 and packetises the data into a series of data packets for transmission via the transceiver 101. Each data packet generated by the packetiser 103 includes a portion of the encoded media data, as well as any applicable packet header data (and other information such as internet protocol header and any other protocol headers). The packetiser 103 (or encoder 102) may assign a sequence number to each packet. The sequence number may indicate the order in which the packets are transmitted by the device 100 and/or the playback sequence for the data contained with each packet. Each packet comprises its sequence number, for example, in the header of the packet. The data packets formed by the packetiser 103 may be, for example, Realtime Transport Protocol (RTP) packets.

The packets formed by the packetiser 103 are transmitted over the network via the transceiver 101 as a stream of data packets. The packet stream may be an RTP stream. The order in which the packets are transmitted may be dependent on the sequence number of the packets.

Device 100 comprises an error correction generator 104 for generating a stream of error correction packets. The error correction packets may be FEC packets that can be used at the receiving device to recover data packets that may not be received at the receiving device. The proportion of FEC packets to data packets that are sent may be varied in dependence on the conditions of the network to help maintain a certain level of media quality at the receiving device. The error correction data for the FEC packets can be generated, for example, by XORing the data packets or from Reed-Solomon (RS) codes. The error correction data may be generated so that all of the data packets can be recovered if all of the FEC packets are received at the receiving device. However, this would require a large amount of bandwidth. To reduce the bandwidth requirement, the error correction data may be generated for recovering certain selected data packets (rather than all packets) within a span of data packets. The data packets may be selected based on their importance. For example, for an audio stream, critical packets that have audio data whose loss cannot be concealed perfectly (by error concealment techniques) if lost in the network may be selected for formation of FEC packets ahead of other packets. In another example, important packets containing video data for an I-frame may be selected ahead of data for a P-frame. Each generated FEC packet may contain an indication of which data packet(s) the error correction data contained within the FEC packet relates to. In other words, each FEC packet may contain an indication of the data packets used to generate that FEC packet. For example, the header of each FEC packet may contain the sequence number(s) of the data packet(s) that are recoverable using that FEC packet.

The error correction generator 104 comprises a critical packet identifier 105, a data packet buffer 106, a payload generator 107, an FEC packetiser 108 and a quality controller 109. These modules of the error correction generator 104, as well as the encoder 102 and the packetiser 103, may be implemented in dedicated hardware or in software which when executed configures general purpose hardware to perform the functions as described herein.

The critical packet identifier 105 can determine a level of importance for each packet in the stream of data packets to be transmitted. For example, packets that are critical for maintaining real-time speech may be classified as having a high level of importance, whereas packets that increase the quality of the speech may be classified as having a lower level of importance. Packets that are classified as having a higher level of importance may be given a greater priority for the generating error correction data for recovering those packets if they are lost in the network. The data packets to be transmitted may be stored at buffer 106. The buffer 106 may store a certain number of the latest packets generated by the packetiser 103. Each of the packets stored at the buffer 106 may be associated with a level of importance that is determined by the identifier 105.

The quality controller 109 determines a level of error correction data to be generated by the payload generator 107. The level of error correction data may be determined based a measure of the quality of the network. For example, the quality controller 109 may receive a percentage packet loss measure for the network (e.g. via a RTCP report) and determine an appropriate level of error correction to compensate for that percentage packet loss.

The payload generator 107 generates the error correction data for recovering selected data packets. The data packets that are selected for being recoverable may be dependent on the level of error correction determined by the quality controller 109. For example, the quality controller 109 may determine that r number of FEC packets should be generated for every k number of data packets. The payload generator 107 then selects the most important data packets that are recoverable from r FEC packets and generates the error correction data from those data packets. The FEC packetiser 108 then packetises that generated error correction data into r number of FEC packets and sends them to the transceiver 101 for transmission. The FEC packet stream may be sent as a separate packet stream to the data packet stream or the FEC packets may be interleaved into the data packet stream. In either case, the (k, r) configuration or ratio (i.e. the number r of FEC packets per k number of data packets) is maintained.

The quality controller 109 may determine the level of error correction in dependence on a measure of consecutive packet loss in the network. A receiving device can determine how many consecutive packets it fails to receive based on the sequence numbers of the data packets. For example, packets are transmitted to the receiving device via the network in an order of consecutive sequence numbers (e.g. 0001, 0002, 0003, . . . ). If the receiving device receives a packet with a sequence number of 0001 and then the next packet it receives has a sequence number of 0006 then this indicates that there has been a loss of 4 consecutive packets (i.e. packets having sequence numbers 0002, 0003, 0004 and 0005). The receiving device can measure this loss and send device 100 a message indicating the measure of this loss. The quality controller 109 may then determine a level of error correction to compensate for the measure of consecutive packet loss.

Preferably, the receiving device (such as device 400 described below) can determine the number of times each number of consecutive packets are lost over a period of time. For example, the receiving device can measure the number of times 0, 1, 2, 3, 4, . . . n consecutive packets are not received by the receiving device. This measure may conveniently be represented in a histogram having bins representing n number of consecutive packets lost and the frequency at which each of those n numbers of consecutive packets are lost for a given period of time. The histogram may be sent from the receiving device to the transmitting device. The histogram may be sent periodically and/or in response to a request from the transmitting device. The quality controller 109 can receive the histograms and analyse them to determine an appropriate level of error correction.

Figure 2:
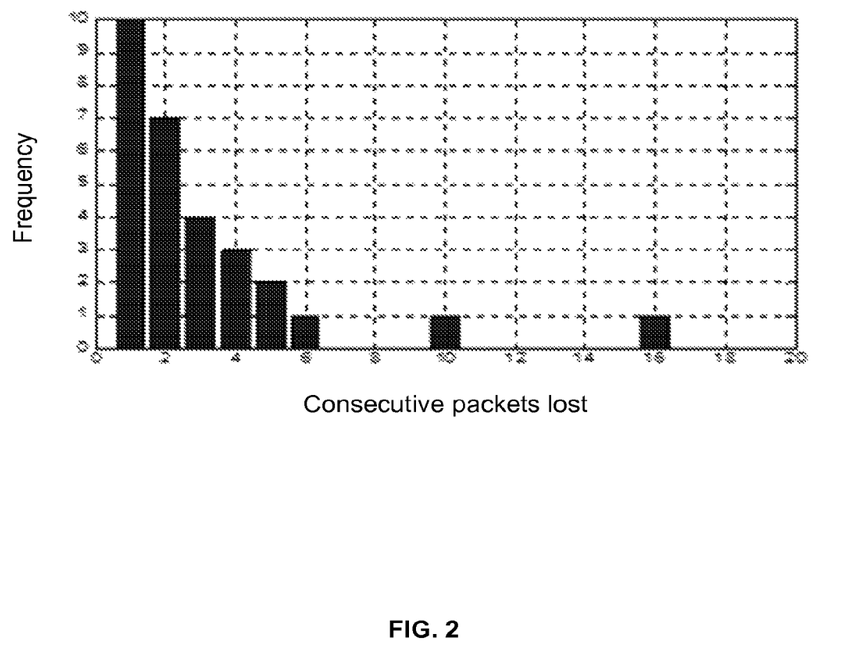
FIG. 2 shows an example histogram.

FIG. 2 is an example histogram showing the frequency of n consecutive packets lost (i.e. not being received at a receiving device) for a network having a −30% packet loss network condition over a period in which about 300 packets are transmitted. The quality controller 109 can analyse the histogram to determine an appropriate number r of FEC packets to send for k number of data packets. The quality controller 109 may determine the lowest number of consecutive packets (i.e. the lowest bin value) that has a predetermined frequency (e.g. a low frequency value such as one or, preferably, zero). Based on this determination, an appropriate (k, r) configuration can be determined.

The first zero (or other predetermined value) bin of the histogram represents "nr" consecutive packets lost in the network. Consecutive losses above nr will occur very rarely in the network. Thus nr is used for determining the (k, r) ratio such that most of the lost data packets can be retrieved at the receiving device. An appropriate (k, r) may be determined so that up to nr consecutive losses in the transmitted packets transmitted can be incurred and still the data packets can be recovered at the receiving device.

Preferably, the determined (k, r) is an indication of the ratio between a maximum number (r) of FEC packets per k data packets. The number of data packets and FEC packets transmitted may be further fine-tuned from other network measures. Thus, the number of FEC packets per k data packets may be the lower (but no greater) than the determined maximum number according to the (k, r) configuration. For example, if the predetermined frequency is zero then from the histogram in FIG. 2, the first (i.e. the lowest value) bin that has a frequency of zero is the bin representing 7 consecutive packets (i.e. nr=7). This indicates that the condition of the network is such that there is a low probability of losing 7 consecutive packets and there is a higher probability of loss for less than 7 consecutive packets. From this, the maximum (k, r) configuration can be determined. For example, the maximum (k,r) could be selected from a data structure comprising optimal k and r values for each possible nr.

The maximum (k, r) configuration selected may be dependent on nr and also a mode of operation of device 100. For example, the device 100 may operate in a mode that is optimised for low delay or bandwidth efficiency or optimal quality. Based on the mode and the first zero frequency bin, an appropriate (k,r) configuration can be selected. For example, for the same first zero frequency bin, the (k, r) combination selected based on a low delay mode is such that the span "k" for generation of FEC packets is decreased compared to a bandwidth efficient mode. For example, if the first zero frequency bin is 8 (as shown in the short filtered histogram of FIG. 3), the maximum (k, r) configuration selected may be (k=3, r=8) for a low delay mode, (k=4, r=8) for a bandwidth efficient mode or (k=4, r=8) for an optimal quality mode. The lower ratio of FEC packets to data packets in the bandwidth efficient mode compared to the low delay mode results in less bandwidth being used for FEC packets and thus more efficient utilisation of the bandwidth. The low delay mode, in contrast, has a higher ratio of FEC packets to data packets, which results in lower delay because a reduced span k requires less buffering delay in the jitter buffer (in the receiver) to retrieve lost packets and thus lower delay. The maximum (k, r) configuration values selected for each bin value for each mode may be predetermined and selectable from a data structure comprising those values. The data structure may be stored in memory (not shown) at device 100.

Preferably, prior to analysing the histogram, the histogram is filtered to remove any outlier values, which may be spurious or unwanted continuous packet losses observed at the receiving device. This helps to eliminate any rarely occurring consecutive packet losses, which may cause a (k, r) configuration to be selected which has an unnecessarily large number of FEC packets, which would consequently lead to a large amount of bandwidth being used.

Figure 3:
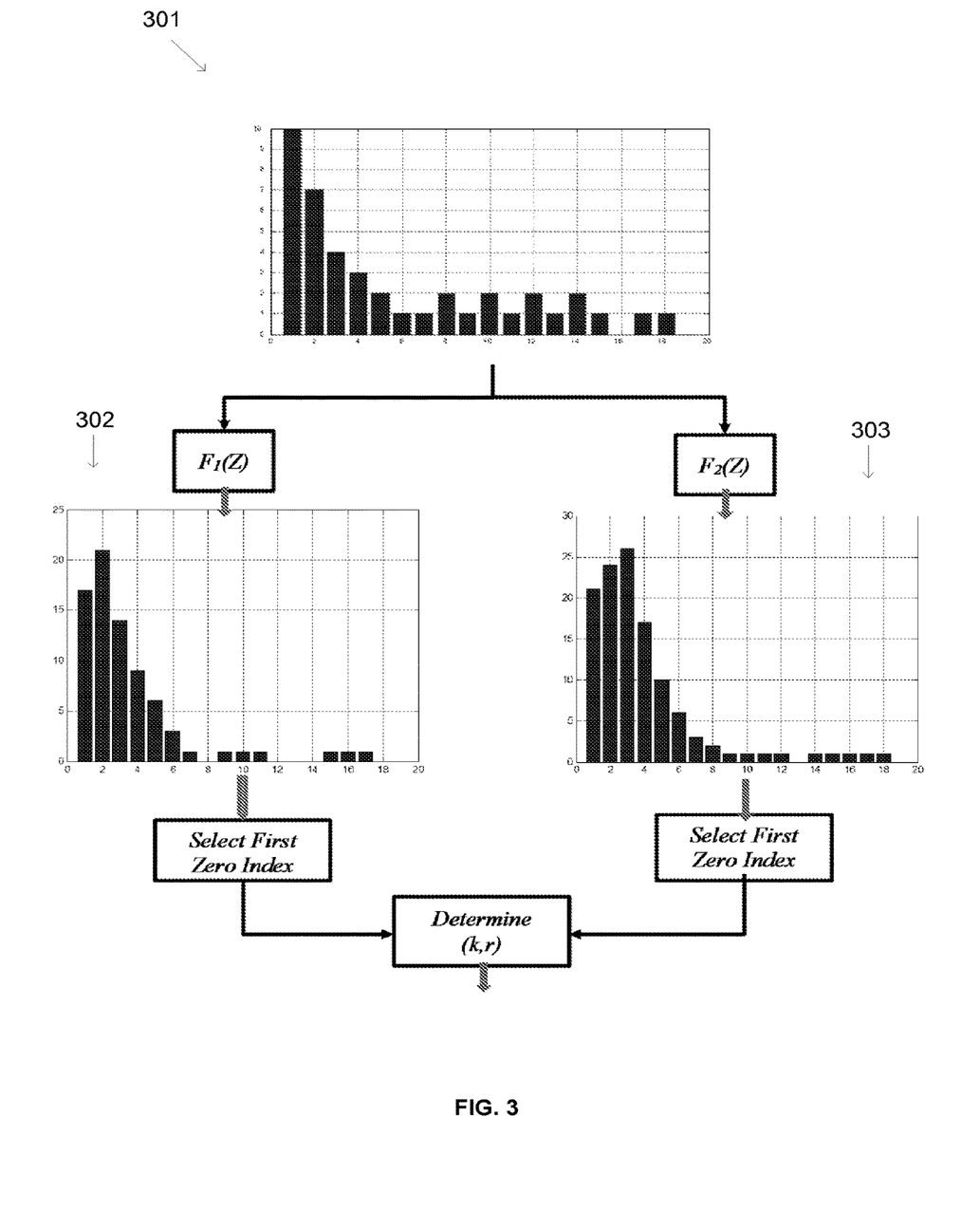
FIG. 3 shows example histograms after filtering.

FIG. 3 illustrates the 2D filtering of a histogram 301. The filter coefficients can be varied based on a mode of operation of the device 100. For example, in a mode optimised for bandwidth efficiency, a long filter $F_2(Z)$ window [1,1,1,1,1] may be selected. In another mode that is optimised for low delays, a short filter $F_1(Z)$ window [1,1,1] may be selected. As above, the first zero frequency bin value of the filtered histograms is used to determine an appropriate (k, r) configuration. In the example shown in FIG. 3, histogram 301 is short filtered to obtain filtered histogram 302 and long filtered to obtain histogram 303. The first zero index of histogram 301 is 16. However, the first zero index of 16 may be influenced by the outlier values. As shown, filtering the histogram removes the outlier values to reduce the first zero index from 16 to 8 when using the short filter and to 13 when using the long filter.

Figure 4:
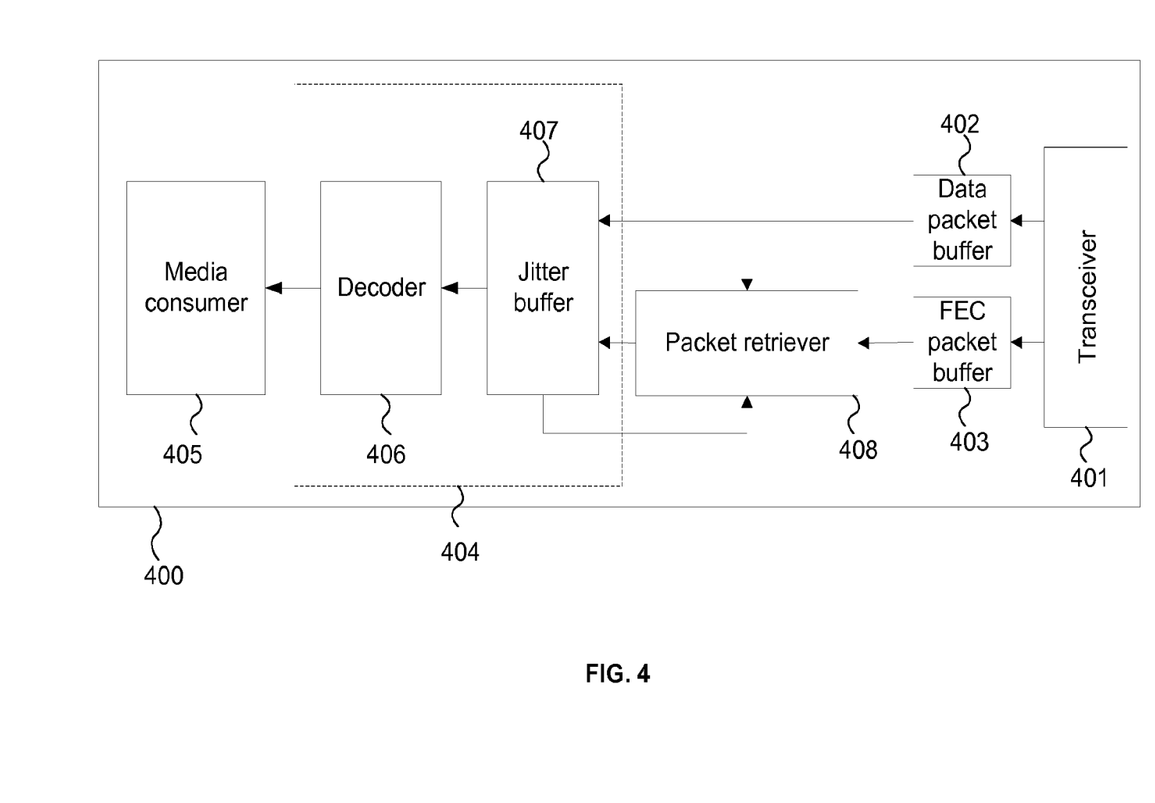
FIG. 4 shows a schematic diagram of a device capable of receiving data packets and FEC packets.

FIG. 4 shows a receive path for a data processing device 400, which may be any suitable device that is capable of receiving and processing packet based data such as a computer, smartphone, videophone, etc. Device 400 comprises a transceiver 401 for connection to a communications network (not shown) such as the internet or other packet based networks. The device 400 can transmit and/or receive data packets to and/or from the communications network via the transceiver 401.

Device 400 comprises a first buffer 402 for receiving a data packet stream and a second buffer 403 for receiving an FEC packet stream from the network via the transceiver 401. The device also comprises a media processor 404 and a media consumer 405. The media processor 404 includes a decoder 406 for decoding data packets to form a media stream. The decoder 406 decodes packets according to the appropriate codec (such as those mentioned above) for the received media data. The media consumer 405 receives the decoded media stream for playing by the media consumer. In the example shown in FIG. 4, the media consumer 405 may be an audio and/or video device, the data packets carrying media data may be RTP packets and the media stream may be video and/or audio. For example, the media stream may be a PCM audio stream.

The media processor 404 comprises a jitter buffer 407 which orders the data packets according the playback sequence of the data in the packets. This sequence may be indicated by the sequence number of the packet. As mentioned above, some transmitted data packets may be lost in the network and thus may not arrive at the device 400. This will lead to gaps in the sequence of data packets at the jitter buffer 407, which can cause the playback of the media at the consumer 405 to degrade in quality, be delayed or stop.

The received FEC packets can be used to recover some or all of the missing data packets. However, current methods for retrieving all of the possible lost packets is very complicated and not real-time implementable. Thus, most current methods do not try to retrieve all of the lost packets and may ignore retrieving data packets that require combinations of different FEC packets. The method described below, however, is capable of retrieving all of the lost packets which can possibly be retrieved from the received data packets and FEC packets, in an efficient manner. This leads to a reduction in the delay for retrieving missing data packets. Furthermore, the method does not need to wait for the arrival of late data packets as the late data packets may be retrieved from received FEC packets or combination of received FEC and data packets. Thus, data packets may be sometimes retrieved even before the same data packet arrives from the data packet stream. This will lead to reduction in the play-out delay.

Device 400 comprises a packet retriever 408 which is configured to selectively retrieve data packets from FEC packets. The packet retriever 408 may be implemented in dedicated hardware or in software which when executed configures general purpose hardware to perform the functions as described herein. The packet retriever 408 may comprise a buffer which is used to maintain information about a predetermined number x of data packets. The buffer may be a circular buffer, where, when the circular buffer is full (i.e. it is storing information about x data packets), information about the earliest data packet stored in the circular buffer is over-written by information about the most recent data packet to be stored in the buffer. The predetermined number x of packets may be, for example, 1000, 500 or 300. The circular buffer may maintain a list of the preceding x sequence numbers from the highest (i.e. most recently transmitted) sequence number of a packet that has been received or retrieved. The list indicates, for each sequence number, whether a packet for that sequence has been received via the data packet stream or retrieved via FEC packets or if it is missing (i.e. it has not been received or retrieved). The predetermined number x may be dependent on buffer memory size, bandwidth, processing capability, packet rate and/or other factors.

The circular buffer may indicate a "no-loss index". The no-loss index indicates the highest sequence number of a data packet that has been received (via the data packet stream) in a group of a predetermined minimum number of consecutively received data packets. In other words, a predetermined minimum number of consecutive sequence numbers is determined and the highest sequence number of the consecutive sequence numbers is indicated by the no-loss index. For example, the predetermined minimum number may be 32. When 32 or more consecutive sequence numbers have been indicated as being received in the circular buffer and the next sequence number is indicated as not being received, the no-loss index is the highest sequence number of the consecutive sequence numbers. The no-loss index will remain at that highest sequence number until another sequence of 32 or more sequence numbers are indicated as being received, such that the no-loss index indicates the highest sequence number of the most recent sequence of 32 or more consecutive sequence numbers.

Device 400 may measure the losses of consecutive data packets (e.g. from their sequence numbers) so as to generate a histogram as described above with reference to FIGS. 2 and 3. Device 400 may send the histogram data to a device (such as device 100) that is transmitting the media stream to device 400. The histogram data may then be used to determine an appropriate level of error correction (for example, as described above).

Figure 5A:
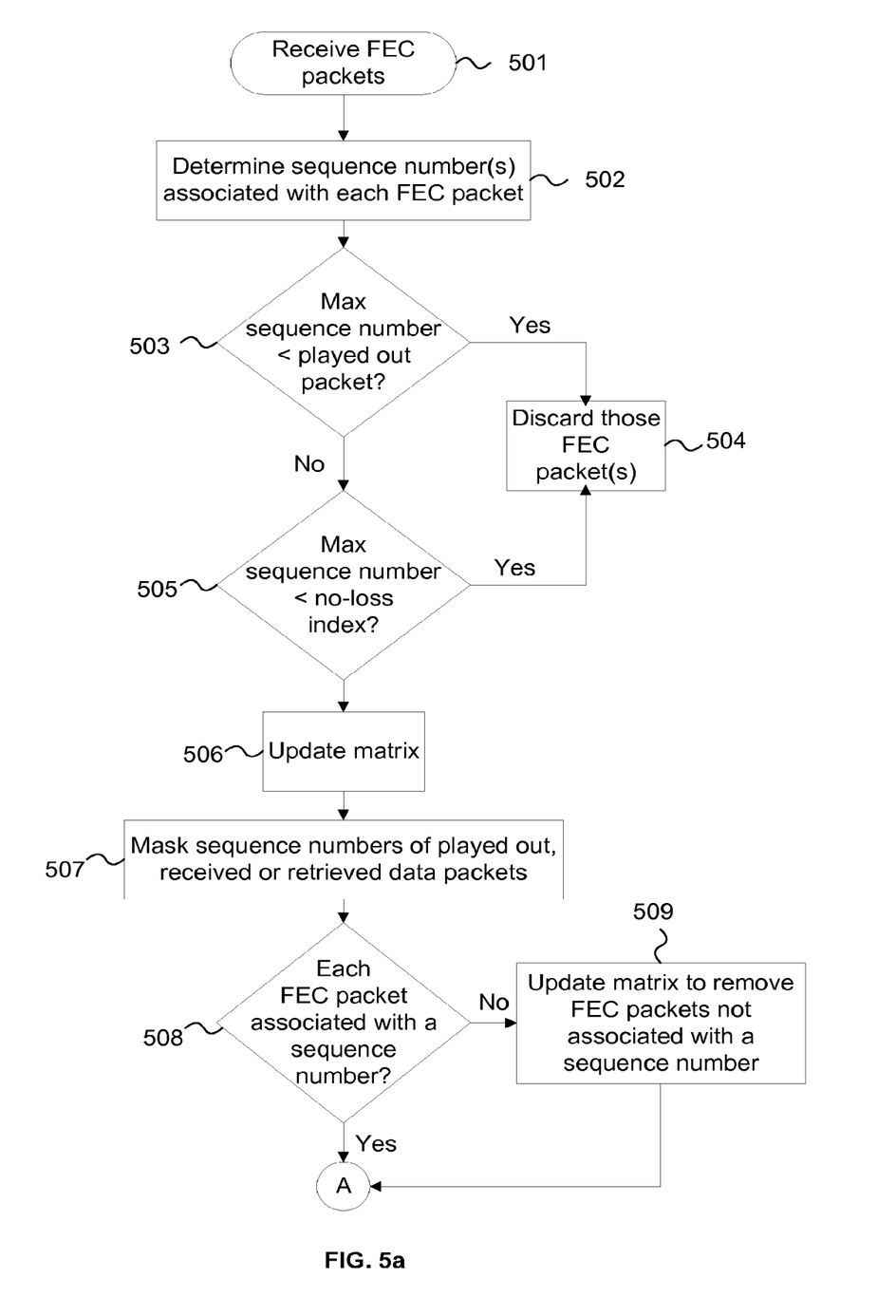
FIGS. 5*a*-5*b* show an example flow chart for processing FEC packets.
Figure 5B:
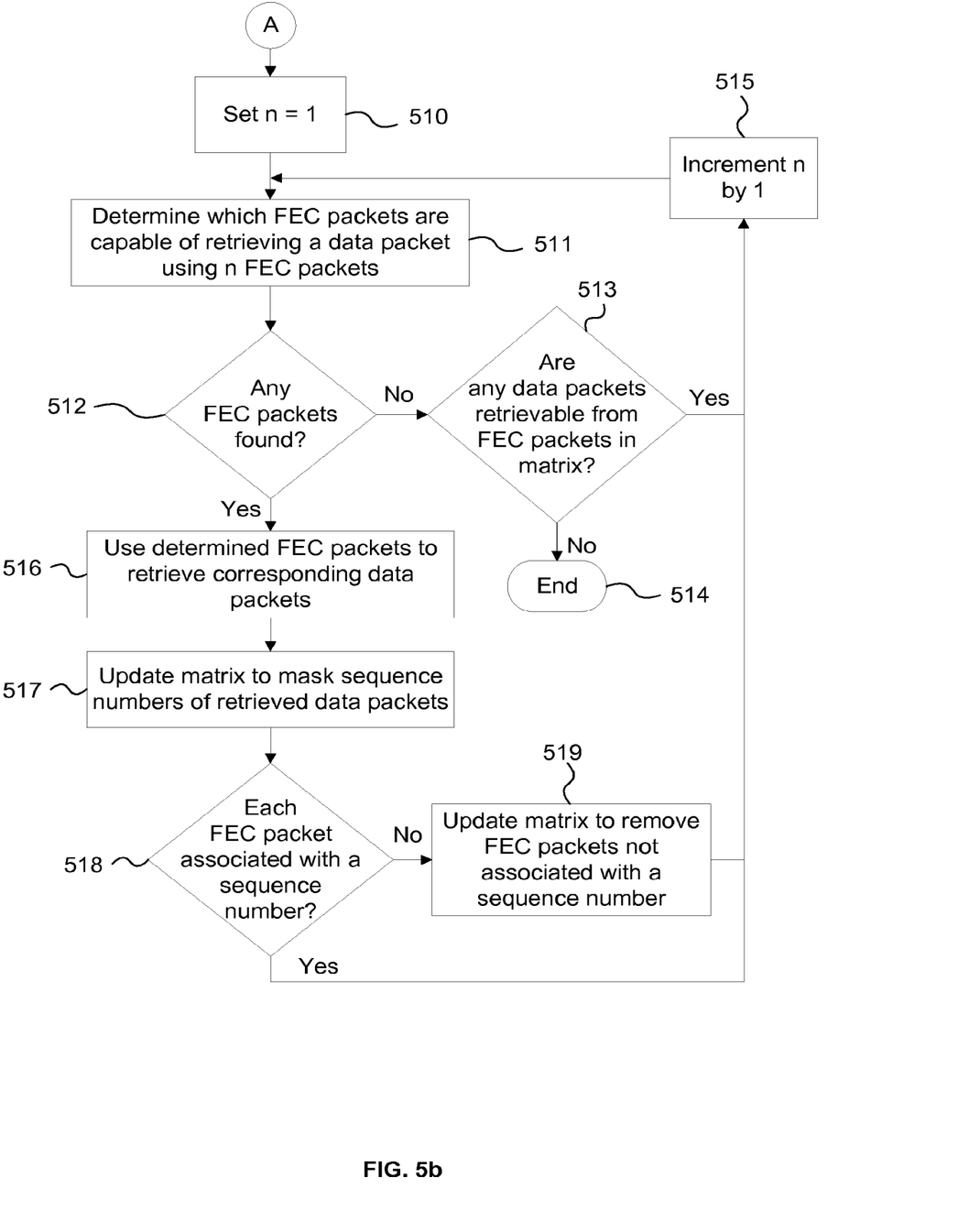

FIGS. 5a and 5b show a flow diagram which illustrates the packet retrieval process carried out by the packet retriever 408 to retrieve data packets from received FEC packets. The process shown in FIGS. 5a and 5b may be carried out upon reception of a new data or FEC packet.

At step 501, data and FEC packets are received. The FEC packets may be received from a packet stream that is a different stream to the stream of data packets.

At step 502, the sequence number(s) of the data packet(s) that each FEC packet is capable of retrieving (either directly from the FEC packet or in combination with one or more other FEC packets) is determined.

At step 503 it is determined if the maximum determined sequence number for each FEC packet is less than the sequence number of the last played out packet (which may be determined from the jitter buffer 407). If it is determined that the maximum sequence number of an FEC packet is less than the sequence number of the last played out packet, then that FEC packet is discarded (step 504). For FEC packets that are determined to have a maximum sequence number that is not less than the sequence number of the last played out packet, the process moves on to step 505.

At step 505, it is determined if the maximum sequence number of each FEC packet is less than the no-loss index (mentioned above). If the maximum sequence number of an FEC packet is less than the no-loss index then that FEC packet is discarded (step 504) because the data packets which may be recovered using that FEC packet have not been lost. For FEC packets that have a maximum sequence number not less than the no-loss index, the process moves on to step 506.

The FEC packets and their associated data packet sequence number(s) are represented in a data structure. At step 506, this data structure is updated to include the remaining FEC packets from step 505. The data structure may be a table or matrix which provides information about which data packets (identifiable from their sequence numbers) can be retrieved from which FEC packets. Matrix 1a below shows an example matrix for FEC packets $FEC_v$ to $FEC_z$. The sequence number (0001-0009) that each FEC packet is associated with is indicated by a "1" in the appropriate column.

Matrix 1a

|  | 0001 | 0002 | 0003 | 0004 | 0005 | 0006 | 0007 | 0008 | 0009 |
|---|---|---|---|---|---|---|---|---|---|
| $FEC_v$ | 1 | 0 | 1 | 1 | 1 | 0 | 0 | 0 | 0 |
| $FEC_w$ | 0 | 0 | 0 | 0 | 0 | 1 | 0 | 0 | 1 |
| $FEC_x$ | 1 | 0 | 0 | 0 | 1 | 0 | 1 | 0 | 0 |
| $FEC_y$ | 0 | 0 | 0 | 0 | 1 | 1 | 1 | 0 | 0 |
| $FEC_z$ | 0 | 0 | 0 | 0 | 0 | 0 | 1 | 1 | 1 |

At step 507, certain locations of the matrix are masked based on data packets that are already received via the data packet stream, data packets that are already retrieved from FEC packets or data packets that are already played out. The masking disassociates an FEC packet with a sequence number of a data packet. For example, FEC packet $FEC_V$ may be capable of being used to retrieve data packets having sequence numbers 0001, 0003, 0004 and 0005. If data packet 0001 has already been played out, then that sequence number is masked from all FEC packets in the matrix, which includes FEC packets $FEC_V$ and $FEC_x$. For example, this may be done by replacing the 1s in the 0001 column with 0s, as shown in matrix 1b. Thus, after masking, FEC packet $FEC_V$ is associated with data packet sequence numbers 0003, 0004 and 0005 in the matrix. Similarly, it may also have been determined at step 507 that the data packet associated with sequence number 0009 has been received and so the 1 s in the 0009 column are replaced with 0s.

Matrix 1b

|  | 0001 | 0002 | 0003 | 0004 | 0005 | 0006 | 0007 | 0008 | 0009 |
|---|---|---|---|---|---|---|---|---|---|
| $FEC_v$ | 0 | 0 | 1 | 1 | 1 | 0 | 0 | 0 | 0 |
| $FEC_w$ | 0 | 0 | 0 | 0 | 0 | 1 | 0 | 0 | 0 |

-continued

| Matrix 1b | | | | | | | | | |
|---|---|---|---|---|---|---|---|---|---|
| | 0001 | 0002 | 0003 | 0004 | 0005 | 0006 | 0007 | 0008 | 0009 |
| $FEC_x$ | 0 | 0 | 0 | 0 | 1 | 0 | 1 | 0 | 0 |
| $FEC_y$ | 0 | 0 | 0 | 0 | 1 | 1 | 1 | 0 | 0 |
| $FEC_z$ | 0 | 0 | 0 | 0 | 0 | 0 | 1 | 1 | 0 |

At step 508, it is determined if each of the FEC packets in the matrix are associated with at least one data packet sequence number or not. For example, masking may lead to an FEC packet to be disassociated with all sequence numbers (e.g. because all of those sequence numbers have been played out). If each of the FEC packets in the matrix is associated with at least one sequence number then the process moves on to step 510. If there are any FEC packets that are not associated with any sequence number, the process moves on to step 509, where the matrix is updated to remove those FEC packets from the matrix. The process then moves to step 510.

At step 510, the process of retrieving data packets using the updated matrix begins. Firstly, n is set to equal 1. n is the number of FEC packets required to retrieve a data packet. n=1 means that one FEC packet (alone or in combination with a data packet) is required to retrieve a data packet. n=2 means that two FEC packets (themselves or in further combination with a data packet) are required to retrieve a data packet. And so on.

At step 511, it is determined which FEC packets in the matrix are capable of retrieving a data packet using n number of FEC packets. At step 512, it is determined whether any FEC packets are found which are capable of retrieving data packets using n number of FEC packets. If no such FEC packets are found, then the process moves to step 513. If at least one such FEC packet is found, then the process moves to step 516.

At step 513, it is determined whether any data packets are retrievable from any of the FEC packets in the matrix (i.e. for any value of n). If not, then the process ends at step 514. If there are data packets that are retrievable from the FEC packets in the matrix then n is incremented by 1 at step 515 and the process returns to step 511.

At step 516, the determined FEC packets are used to retrieve the corresponding data packets. The retrieved data packets are then added to the jitter buffer 407 in the appropriate order according to the sequence number of the retrieved packets.

At step 517, the matrix is updated to mask the sequence numbers of the data packets that have been retrieved.

For example, for matrix 1b and n=2, FEC packets $FEC_w$ and $FEC_y$ can be XORed to retrieve the data packet having sequence number 0006. This data packet is retrieved and the table 1b is updated to mask the 0006 column by replacing the 1s with 0s. Matrix 1c shows the updated table.

| Matrix 1c | | | | | | | | | |
|---|---|---|---|---|---|---|---|---|---|
| | 0001 | 0002 | 0003 | 0004 | 0005 | 0006 | 0007 | 0008 | 0009 |
| $FEC_y$ | 0 | 0 | 1 | 1 | 1 | 0 | 0 | 0 | 0 |
| $FEC_w$ | 0 | 0 | 0 | 0 | 0 | 0 | 0 | 0 | 0 |
| $FEC_x$ | 0 | 0 | 0 | 0 | 1 | 0 | 1 | 0 | 0 |
| $FEC_y$ | 0 | 0 | 0 | 0 | 1 | 0 | 1 | 0 | 0 |
| $FEC_z$ | 0 | 0 | 0 | 0 | 0 | 0 | 1 | 1 | 0 |

At step 518, it is determined if each FEC packet in the matrix is associated with at least one data packet sequence number or not. If each of the FEC packets in the matrix is associated with at least one sequence number then, then the process moves on to step 515. If there are any FEC packets that are not associated with any sequence number, the process moves on to step 519, where the matrix is updated to remove those FEC packets from the matrix. The process then moves on to step 515.

In the example of matrix 1c, $FEC_w$ is no longer associated with any sequence number and so the matrix is updated to remove $FEC_w$ as shown in matrix 1d.

| Matrix 1d | | | | | | | | | |
|---|---|---|---|---|---|---|---|---|---|
| | 0001 | 0002 | 0003 | 0004 | 0005 | 0006 | 0007 | 0008 | 0009 |
| $FEC_y$ | 0 | 0 | 1 | 1 | 1 | 0 | 0 | 0 | 0 |
| $FEC_x$ | 0 | 0 | 0 | 0 | 1 | 0 | 1 | 0 | 0 |
| $FEC_y$ | 0 | 0 | 0 | 0 | 1 | 0 | 1 | 0 | 0 |
| $FEC_z$ | 0 | 0 | 0 | 0 | 0 | 0 | 1 | 1 | 0 |

At step 515 n is incremented by 1 and the process returns to step 511. The process continues from step 511 with the new n value. The loop of steps 511 to 519 is repeated for different values of n until, at step 513, there are no more data packets retrievable from FEC packets in the matrix. Thus, at this point, all of the data packets that are capable of being retrieved using the FEC packets in the matrix have been retrieved.

By using this process, the searching complexity is reduced as FEC packets that are no longer suitable for retrieving packets are removed at various stages. Furthermore, by reducing the searching complexity in this way, a greater proportion of FEC packets are utilised individually or in combination with other FEC packets to retrieve missing data packets. Thus fewer FEC packets are discarded compared to conventional methods and a greater proportion of missing data packets are retrieved.

The data processing devices of FIGS. 1 and 4 are shown as comprising a number of functional blocks. This is for illustrative purposes only and is not intended to define a strict division between different parts of hardware on a chip or between different programs, procedures or functions in software. The term logic as used herein can refer to any kind of software, hardware, or combination of hardware and software.

Data processing devices configured in accordance with the present invention could be embodied in hardware, software or any suitable combination of hardware and software. A data processing device of the present invention could comprise, for example, software for execution at one or more processors (such as at a CPU and/or GPU), and/or one or more dedicated processors (such as ASICs), and/or one or more programmable processors (such as FPGAs) suitably programmed so as to provide functionalities of the data processing device, and/or heterogeneous processors comprising one or more dedicated, programmable and general purpose processing functionalities. In preferred embodiments of the present invention, the data processing device comprises one or more processors and one or more memories having program code stored thereon, the data processors and the memories being such as to, in combination, provide the claimed data processing device and/or perform the claimed methods.

The term software as used herein includes executable code for processors (e.g. CPUs and/or GPUs), firmware, bytecode, programming language code such as C or OpenCL, and modules for reconfigurable logic devices such as FPGAs. Machine-readable code includes software and code for defining hardware, such as register transfer level (RTL) code as might be generated in Verilog or VHDL.

Any one or more of the algorithms and methods described herein could be performed by one or more physical processing units executing program code that causes the unit(s) to perform the algorithms/methods. The or each physical processing unit could be any suitable processor, such as a CPU or GPU (or a core thereof), or fixed function or programmable hardware. The program code could be stored in non-transitory form at a machine readable medium such as an integrated circuit memory, or optical or magnetic storage. A machine readable medium might comprise several memories, such as on-chip memories, computer working memories, and non-volatile storage devices.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A method of transmitting data, comprising:
   determining, from a plurality of bins, each bin representing a number of consecutive missing data packets and having a frequency indicating a number of occurrences of that number of consecutive missing data packets, the bin representing the smallest number of consecutive missing data packets which has a predetermined frequency;
   selecting a ratio of a number of data packets and a number of error correction packets in dependence on a measure of consecutive packet loss in a network; and
   transmitting a stream of data packets and a stream of error correction packets over said network, wherein a proportion of error correction packets to data packets is commensurate with the selected ratio.

2. The method as claimed in claim 1, wherein the determining step comprises deriving the measure from a histogram having the plurality of bins.

3. The method as claimed in claim 2, the deriving comprising analysing the histogram so as to determine the bin representing the smallest number of consecutive missing data packets which has a predetermined frequency.

4. The method as claimed in claim 2, further comprising receiving the histogram from a receiving device and transmitting the stream of data packets and error correction packets from a transmitting device to the receiving device.

5. The method as claimed in claim 2, further comprising, prior to deriving the measure, filtering the histogram so as to remove outlier occurrences of consecutive packets lost in the network.

6. The method as claimed in claim 5, wherein the histogram is filtered with a filter having a window size dependent on a transmission mode, the mode being dependent on a measure of network quality.

7. The method as claimed in claim 1, further comprising generating the stream of data packets, and generating the stream of error correction packets in dependence on the stream of data packets such that the proportion of error correction packets generated to data packets generated is commensurate with the selected ratio.

8. The method as claimed in claim 1, further comprising transmitting the stream of data packets and the stream of error correction packets as different streams.

9. The method as claimed in claim 1, wherein each data packet is associated with a sequence number, and the measure of consecutive packets is dependent on a determination of sequence numbers associated with packets not received at a or the receiving device.

10. The method as claimed in claim 1, wherein the selected ratio is dependent on a transmission mode, the mode being dependent on a measure of network quality.

11. The method as claimed in claim 7, wherein generating the stream of error correction packets further comprises generating error correction packets in dependence on a packet type of the data packets generated in the stream of data packets.

12. The method as claimed in claim 1, wherein the data packets comprise media data for a media stream.

13. The method as claimed in claim 1, wherein the data packets are RTP packets.

14. The method as claimed in claim 1, wherein the error correction packets are forward error correction packets.

15. A data processing device comprising:
    an error correction generator configured to:
       determine, from a plurality of bins, each bin representing a number of consecutive missing data packets and having a frequency indicating a number of occurrences of that number of consecutive missing data packets, the bin representing the smallest number of consecutive missing data packets which has a predetermined frequency; and
       select a ratio of a number of data packets and a number of error correction packets in dependence on a measure of consecutive packet loss in a network; and
    a first transmitter configured to transmit a stream of data packets, the error correction generator being further configured to transmit a stream of error correction packets wherein a proportion of error correction packets to data packets is commensurate with the selected ratio.

16. The data processing device as claimed in claim 15, wherein the error correction generator is configured to derive the measure from a histogram having the plurality of bins.

17. The data processing device as claimed in claim 16, wherein the error correction generator is configured to derive the measure by analysing the histogram so as to determine the bin representing the smallest number of consecutive missing data packets which has a predetermined frequency.

18. The data processing device as claimed in claim 16, the error correction generator being further configured to, prior to deriving the measure, filter the histogram so as to remove outlier occurrences of consecutive packets lost in the network.

19. A non-transitory computer readable storage medium having stored thereon computer executable code that causes at least one processor to implement the method as set forth in claim 1 when the code is run.

20. A non-transitory computer readable storage medium having stored thereon an integrated circuit dataset description of a data processing device, that when processed by an integrated circuit manufacturing system causes the integrated circuit manufacturing system to manufacture a data processing device as set forth in claim 15.

\* \* \* \* \*